(12) United States Patent
Venkata

(10) Patent No.: US 10,181,344 B1
(45) Date of Patent: Jan. 15, 2019

(54) MEMORY DEVICE WRITE CIRCUITRY

(71) Applicant: Micron Technology, Inc., Boise, ID (US)

(72) Inventor: Harish N. Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 15/855,485

(22) Filed: Dec. 27, 2017

(51) Int. Cl.
G11C 11/401 (2006.01)
G11C 11/408 (2006.01)
G11C 11/4091 (2006.01)

(52) U.S. Cl.
CPC ........ G11C 11/401 (2013.01); G11C 11/4085 (2013.01); G11C 11/4091 (2013.01)

(58) Field of Classification Search
CPC .................. G11C 11/4091; G11C 11/4085
See application file for complete search history.

(56) References Cited

U.S. PATENT DOCUMENTS

| | | | | |
|---|---|---|---|---|
| 5,491,655 | A * | 2/1996 | Hirose | G11C 7/14 365/177 |
| 6,381,180 | B1 * | 4/2002 | Merritt | G06F 12/0638 365/189.05 |
| 2005/0146957 | A1 * | 7/2005 | Lee | G11C 7/12 365/203 |
| 2008/0130383 | A1 * | 6/2008 | Kushida | G11C 7/18 365/191 |

* cited by examiner

*Primary Examiner* — Ajay Ojha
(74) *Attorney, Agent, or Firm* — Fletcher Yoder, P.C.

(57) ABSTRACT

Devices and methods include, for a memory device, generating a main input-output line signal on a main input-output line using driving circuitry. The main input-output line is coupled to multiple sensing amplifiers. Each of the sensing amplifiers each locally generate a local data line from the main data line. Each of the sensing amplifiers also includes multiple local sensing amplifiers that are selectively coupled to the generated local data line for overwriting data in the respective local sensing amplifiers.

7 Claims, 6 Drawing Sheets

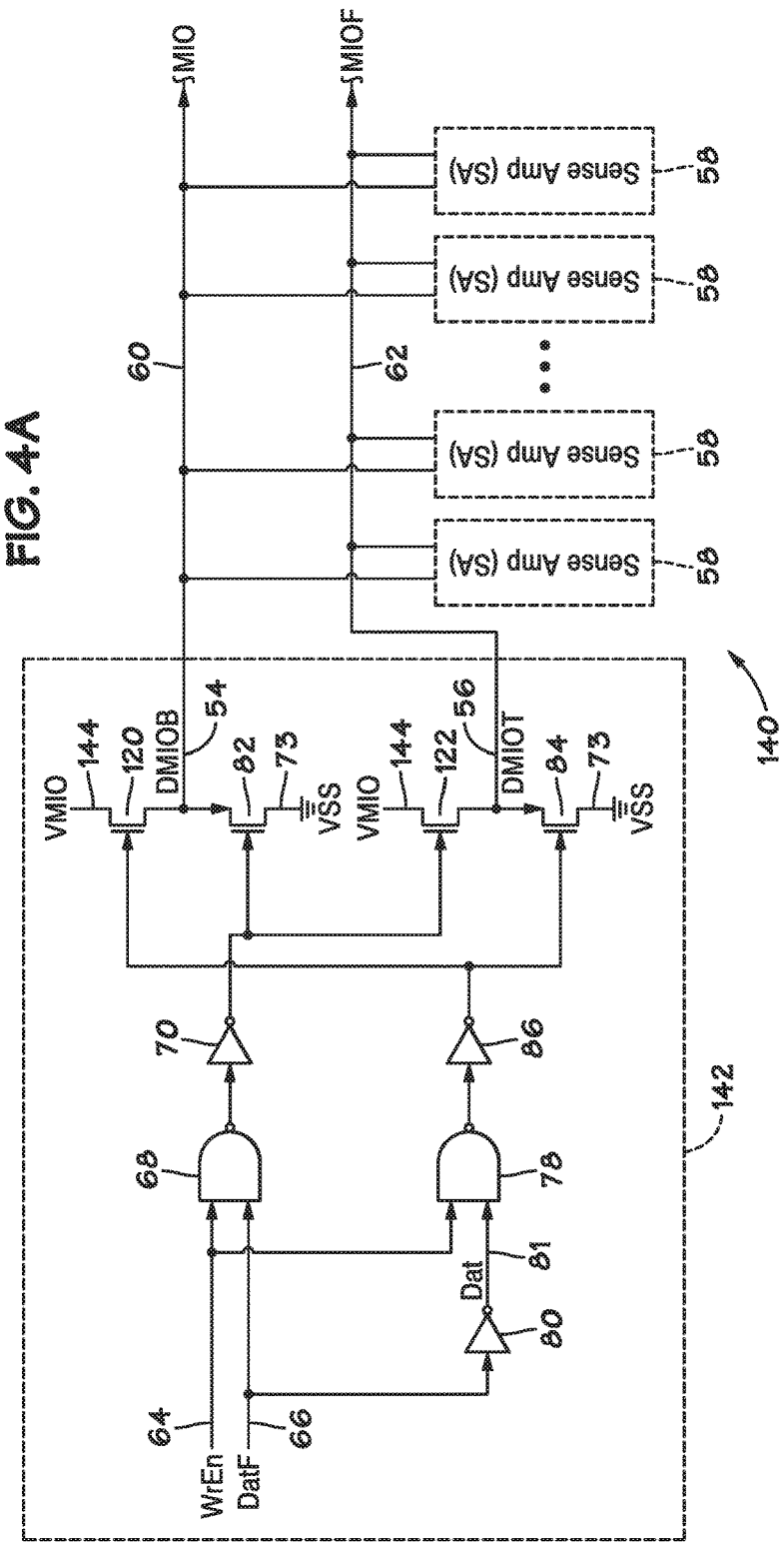

MEMORY DEVICE WRITE CIRCUITRY

BACKGROUND

Field of the Present Disclosure

Embodiments of the present disclosure relate generally to the field of semiconductor devices. More specifically, embodiments of the present disclosure relate to using write circuitry for a semiconductor device.

Description of Related Art

Semiconductor devices (e.g., memory devices) may utilize a pre-fetch (e.g., 16 bits) to transfer bits. In a X16 configuration, the semiconductor device may fetch many data bits (e.g., 16 bits×16=256 bits) at a time. For a high-density memory device, the data lines may span long distances resulting in high capacitances. Furthermore, the memory devices of one type (e.g., double data rate five (DDR5)) may include a number of data lines double that of memory devices of another type (e.g., DDR4). This increase in data lines in the same area, further increases capacitance due to reduced space for each data line. The additional capacitance (and resistivity of the long lines) of high-density DDR5 over DDR4 may negatively impact performance of the DDR5 semiconductor devices if not properly addressed.

Embodiments of the present disclosure may be directed to one or more of the problems set forth above.

BRIEF DESCRIPTION OF DRAWINGS

FIGS. 4A and 4B illustrate a schematic view of circuitry including the driving circuitry and an alternative embodiment of sensing amplifiers having a local data line generator, according to an embodiment of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices read from and/or write to memory banks using sensing amplifiers that utilize data lines to the sensing amplifiers. As the density of the memory devices increase, capacitance in the memory device increases due to an increase in numbers of lines in the memory device. Also, as the density increases, the data line lengths increase thereby increasing resistivity of the data lines on the memory device. The increase in capacitance and resistivity increases the difficulty in overwriting the sensing amplifiers. Furthermore, as more sensing amplifiers are included due to increased density, power consumption increases in the memory device. Moreover, due to long lengths of the data lines, sensing amplifiers near a driver of the data line react differently to write commands causing write performance variance between sensing amplifiers based on distance from the driver. To address these issues, the data lines may be used to generate local data lines to isolate the main data lines from the local data lines by using the data lines to connect to gates of pull down transistors that selectively pull down a local data line or its complementary local data line. By isolating the main data lines from the local data lines, the main data lines may carry smaller voltages (e.g., larger than or equal to a threshold voltage) rather than a full rail (e.g., VDD). This reduces power consumption. Furthermore, as discussed below, due to the local generation of the local data lines, overwriting the sensing amplifiers is made easier, timing is improved, and variation between sensing amplifiers is reduced/eliminated.

Figure 1:
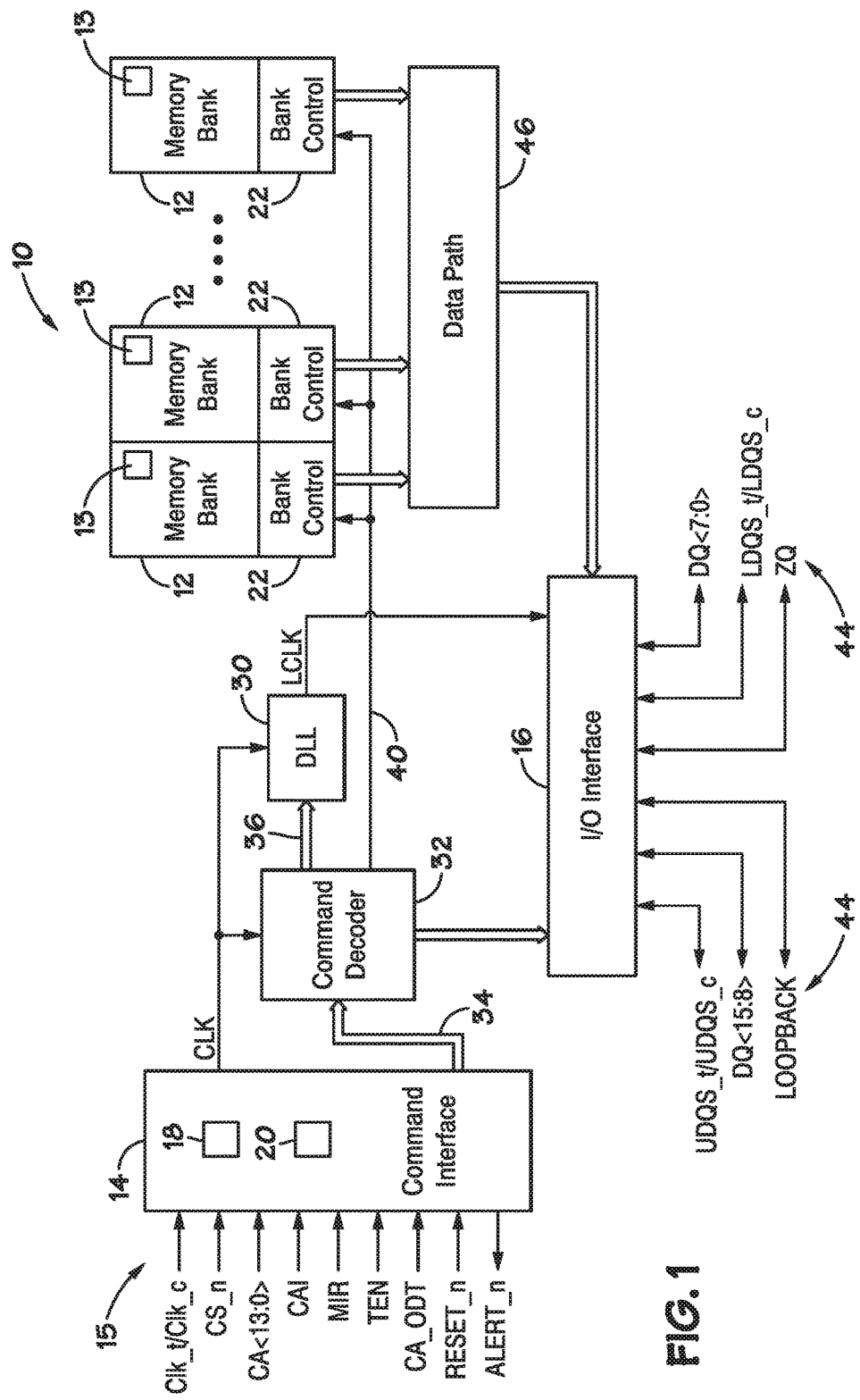
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system. The memory banks 12 may each utilize multiple sensing amplifiers circuitry 13 that uses sensing amplifiers accessed by data lines to write and/or read the sensing amplifiers for operations on the memory banks 12.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the bar clock signal (Clk_b). The positive clock edge for DDR refers to the point where the rising true clock signal Clk_t/crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t/) and the bar clock signal (Clk_b) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. In some embodiments, as discussed below, the clock input circuit 18 may include circuitry that splits the clock signal into multiple (e.g., 4) phases. The clock input circuit 18 may also include phase detection circuitry to detect which phase receives a first pulse when sets of pulses occur too frequently to enable the clock input circuit 18 to reset between sets of pulses.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes a plurality of bi-directional data buses. Data TO signals, generally referred to as DQ signals, are generally transmitted and received in one or more bi-directional data busses. For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_b), the DQS signals may be provided as a differential pair of data strobe signals (DQS_t/and DQS_b) to provide differential pair signaling during reads and writes. For certain memory devices, such as a DDR5 SDRAM memory device, the differential pairs of DQS signals may be divided into upper and lower data strobe signals (e.g., UDQS_t/and UDQS_b; LDQS_t/and LDQS_b) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2A:
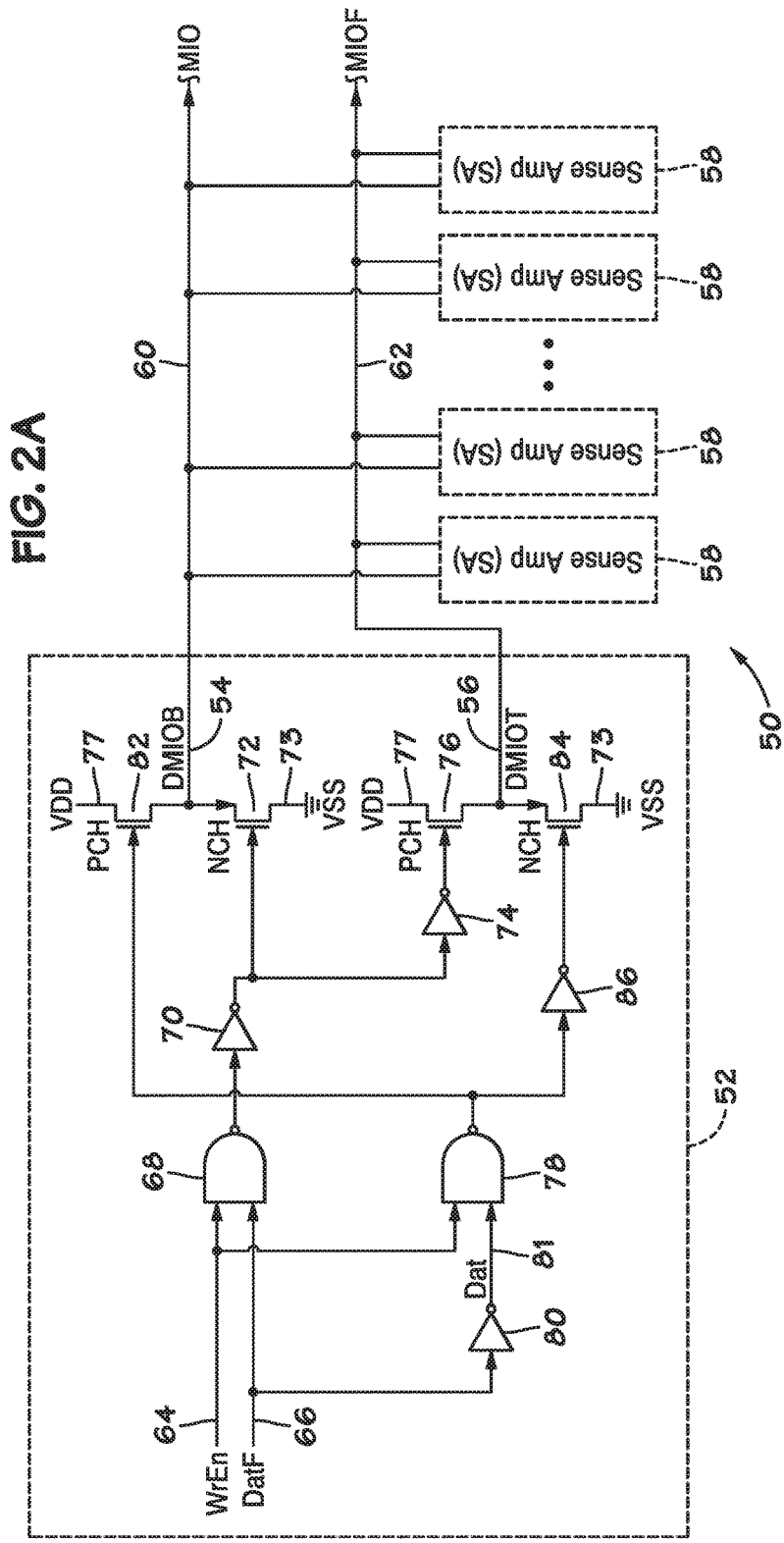
FIGS. 2A and 2B illustrate a schematic view of circuitry including driving circuitry and sensing amplifiers, according to an embodiment of the present disclosure.
Figure 2B:
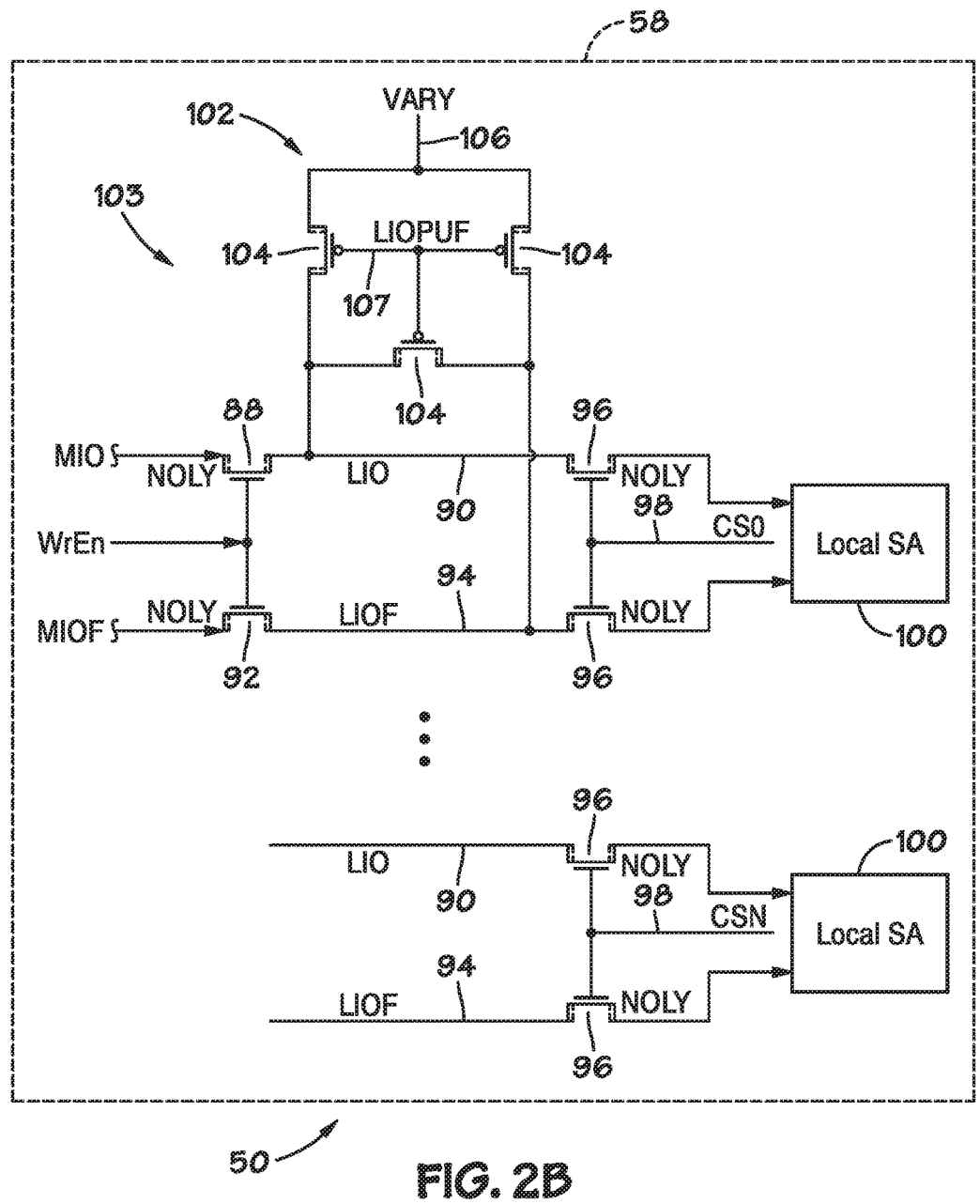

FIGS. 2A and 2B, collectively, illustrate circuitry 50 that may be used in writing data to the memory banks 12. In some embodiments, the circuitry 50 may included in the memory banks 12, the bank control 20, and/or other locations suitable for controlling reads and writes to the memory banks 12. The circuitry 50 includes driving circuitry 52 that generates a driving main input-output bar (DMIOB) 54 and a driving main input-output true (DMIOT) 56. The DMIOB 54 and the DMIOT 56 in turn drive a main input-output data line (MIO) 60 and a main input-output false data line (DMIOF) 62 that is complementary to the MIO 60. The DMIOB 54 and the DMIOT 56 may be used to drive sensing amplifiers 58 to cause reads from and/or writes to the memory banks 12. In some embodiments, the circuitry 50 may include a number (e.g., 64 to 96) of sensing amplifiers 58.

As illustrated, the driving circuitry 52 receives a write enable 64 and a data false 66. The write enable 64 indicates whether a write is to occur in the memory banks 12 and/or to the sensing amplifiers 58. The data false 66 indicates a logical complement of external data being passed. As illustrated, the data false 66 may be a logic high when external data a logic low and vice versa. The write enable 64 and the data false 66 are passed to a NAND gate 68 that produces a logic high unless the write enable 64 is asserted and the data false 66 indicates that no data is being passed. The output of the NAND gate 68 is passed to an inverter 70 that controls whether a transistor 72 connects the DMIOB 54 to VSS 73 to tie the DMIOB 54 to VSS 73. As noted, this connection only occurs when the write enable 64 is asserted and external data is low, as indicated by logic high of the data false 66. The output of the inverter 70 is also passed to another inverter 74 that then controls transistor 76 to determine whether DMIOT 56 is connected to VDD 77. Since the transistor 76 is a P-channel type transistor, the inverter 74 causes DMIOT 56 to be coupled to VDD 77 when the write enable 64 is asserted and the data false 66 indicates that external data is a logic low.

In addition to the NAND gate 68, the circuitry 50 includes a NAND gate 78 that receives the write enable 64. In addition to the write enable 64, the NAND gate 78 receives the data false 66 after inversion through an inverter 80. In other words, the NAND gate 78 receives a data true signal 81 that is a logical complement of the data false 66. The NAND gate 78 outputs a logic high unless the write enable 64 and the data true 81 are both high. A transistor 82 receives the output of the NAND gate 78. Since the transistor 82 is a P-channel transistor, when the output of the NAND gate 78 is a logic low, the transistor 82 receives the output and uses the output to couple DMIOB 54 to VDD 77. In other words, this condition occurs only when the transistor 72 does not couple DMIOB 54 to VSS 73 due to the data false 66. Thus, the write enable 64 and the data false 66 may cause the DMIOB 54 to be switched from rail (VDD 77) to rail (VSS 73). In addition to the transistor 82, the output of the NAND gate 78 is passed to a transistor 84 through an inverter 86 to couple DMIOT 56 to VSS 73.

Thus, the driving circuitry 52 couples DMIOB 54 to VSS 73 when the write enable 64 is asserted and data false 66 is high, and the driving circuitry 52 couples DMIOT 56 to VDD 77 when write enable 64 is asserted and data false 66 is high. Similarly, the driving circuitry couples DMIOB 54 to VDD 77 when the write enable 64 is asserted and data false 66 is low, and the driving circuitry 52 couples DMIOT 56 to VSS 73 when write enable 64 is asserted and data false 66 is low. If write enable 64 is not asserted, the driving circuitry 52 does not change DMIOB 54 or DMIOT 56 regardless of data false 66 assertion.

DMIOB 54 is tied to MIO 60, and DMIOT 56 is tied to MIOF 62. These data lines are passed to the sensing amplifiers 58. In the illustrated example sensing amplifier 58, the MIO 60 is received at a source of gate transistor 88 that uses the write enable 64 to pass the charge on the MIO 60 to the rest of the sensing amplifier 58 as a local input-output data line (LIO) 90. Similarly, the MIOF 62 is received at a source of gate transistor 92 that uses the write enable 64 to pass the charge on the MIOF 62 to the rest of the sensing amplifier 58 as a local input-output false data line (LIOF) 94. It should be noted that the MIO 60 passes charge directly in line with the LIO 90 through the source of the transistor 88 and that the MIOF 62 passes charge directly in line with the LIOF 94 through the source of the transistor 92.

The LIO 90 and the LIOF 94 are passed to multiple local gate transistors 96 that utilize column selector signals 98 to select an appropriate local sensing amplifier 100 from multiple local sensing amplifiers 100 in the current sensing amplifier 58. In some embodiments, each sensing amplifier 58 may include 64 to 128 or more local sensing amplifiers 100.

Each sensing amplifier 58 may also include line equalizer/pre-charge circuitry 103 that uses transistors 104 to emphasize or pre-charge the LIO 90 and LIOF 94 to voltage 106. In some embodiments, the voltage 106 may be half of a peak voltage applied to MIO 60 and MIOF 94. For example, when MIO 60 and MIOF 94 are driven by VSS 73 and VDD 77, the voltage 106 may be half of the difference between VDD 77 and VSS 73 (e.g., V=½VDD when VSS 73 is ground). The pre-charge may be controlled using a local input-output data line pull up control signal (LIOPUF) 107. Since the transistors 104 in the illustrated embodiment are p-channel transistors, the LIOPUF 107 asserts low when the LIO 90 is to be pre-charged. A complementary signal may be used if n-channel transistors are used in the line equalizer/pre-charge 103 instead of p-channel transistors.

In summary, in the circuitry 50, the MIO 60 and MIOF 62 switch from rail to rail (e.g., VDD 77 to VSS 73/Gnd). Moreover, as may be appreciated, the circuitry 50 may be problematic in some implementations. For example, with long lines that are due to high-density in the memory device 10 and a large number (e.g., 256) of bits switched, current draw may be significant in the circuitry 50. Moreover, due to the long (resistive) lines with increased capacitance per line, flipping/overwriting the sensing amplifiers 58 may be difficult and/or may effect a speed of writing to the sensing amplifiers. Furthermore, data lines are shared between sensing amplifiers 58 creating a potential write performance variance depending on how close the sensing amplifier 58 is to the driving circuitry 52.

Figure 3:
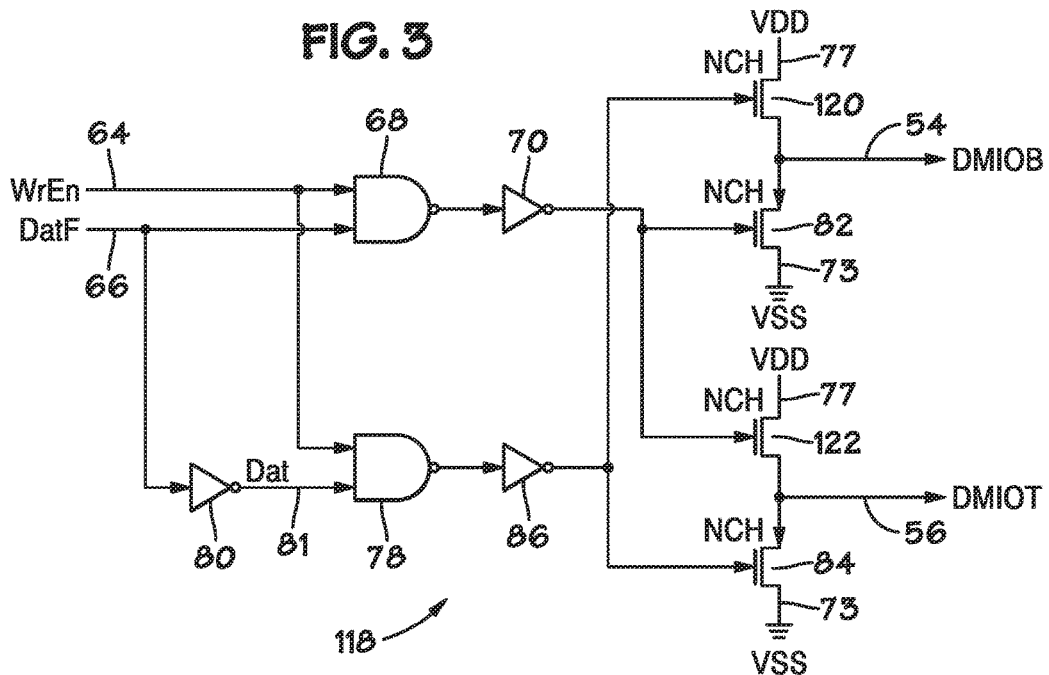
FIG. 3 is a schematic view of an alternative embodiment of the driving circuitry of FIGS. 2A and 2B, according to an embodiment of the present disclosure.

FIG. 3 illustrates driving circuitry 118 that produces the DMIOB 54 and the DMIOT 56 similar to the driving circuitry 52 of FIGS. 2A and 2B. However, the driving circuitry 118 uses n-channel transistors 120 and 122 instead of the p-channel transistors 76 and 82. By including the n-channel transistors 120 and 122 instead of the p-channel transistors 76 and 82, power lost due to a threshold voltage (e.g., $V_{TH}$=0.2-0.3V) of the n-channel transistors is reduced. To accommodate the different driving schemes inherent in replacing p-channel transistors with n-channel transistors, the n-channel transistor 120 is coupled to the inverter 86 rather than directly from the NAND gate 78. Similarly, the n-channel transistor 122 is coupled to the inverter 70 directly, and the inverter 74 of the driving circuitry 52 from FIGS. 2A and 2B is omitted from the driving circuitry 118. Since less voltage is lost to $V_{TH}$, VDD 77 may reside in the driving circuitry 118 from a level used in the driving circuitry 52, thereby reducing power consumption/current draw in the circuitry 50. However, the driving circuitry 118 does not address the difficulty in overwriting the sensing amplifiers 58 or variation between write performance based on distance from the driving circuitry 118.

Figure 4B:
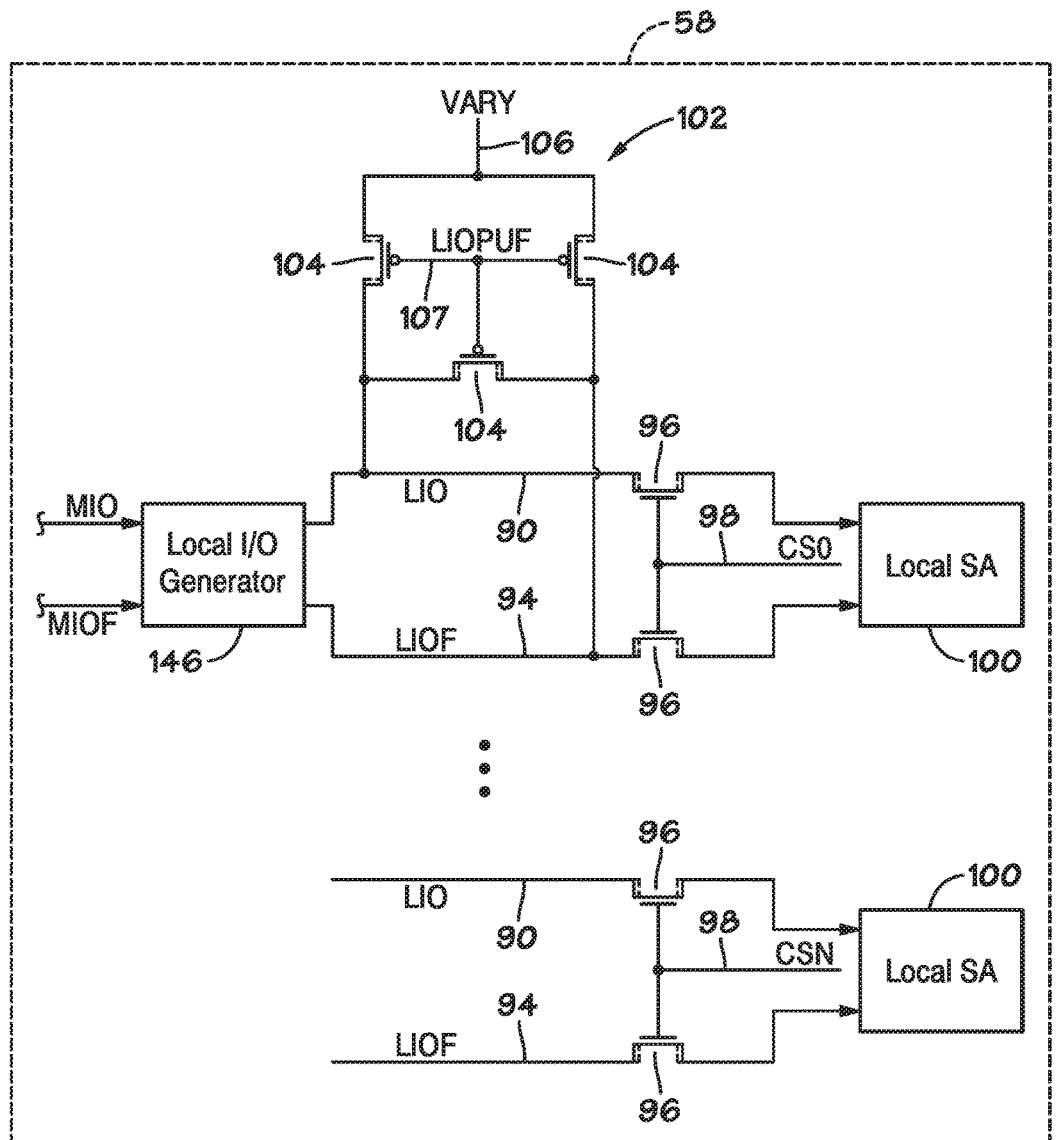

FIGS. 4A and 4B, collectively, illustrate circuitry 140 that writes to the sensing amplifier columns 100. The circuitry 140 is similar to the circuitry 50 of FIGS. 2A and 2B. However, the circuitry 140 utilizes driving circuitry 142 that is similar to the driving circuitry 118 except that the driving circuitry 142 utilizes a main input-output voltage (VMIO) 144 that may be lower than the VDD 77 even if VDD 77 is lowered in the driving circuitry 118 by $V_{TH}$ from the levels in the driving circuitry 52. Indeed, as discussed below in reference to FIG. 5, VMIO 144 may be approximately half of VDD 73 of FIGS. 2A and 2B due to the use of local input-output (10) generators 146 to generate the LIO 90 and the LIOF 94 in the sensing amplifier 58.

Figure 5:
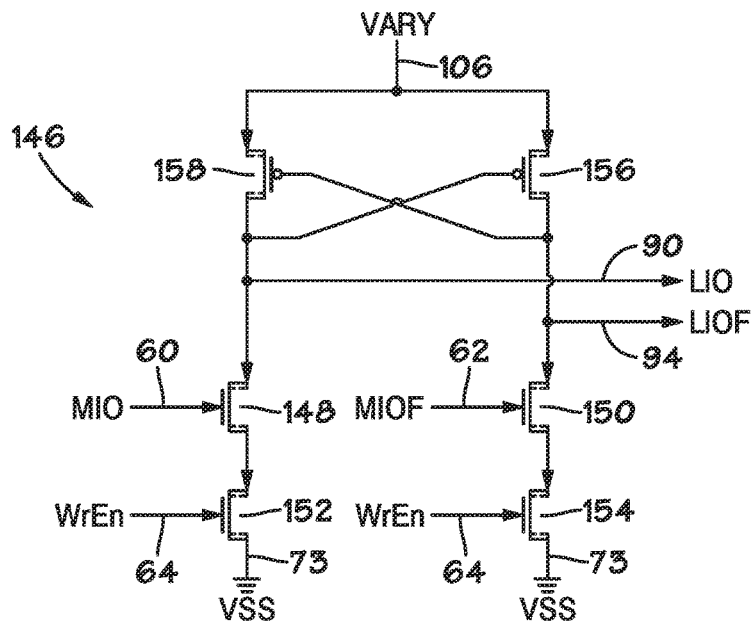
FIG. 5 is a schematic view of the local data line generator of FIGS. 4A and 4B, according to an embodiment of the present disclosure.

The circuitry 140 reduces power consumption and, as noted below, provides local generation of the LIO 90 and LIOF 92 that may improve variance write performance issues and eases overwriting local sensing amplifiers 100. FIG. 5 illustrates an embodiment of the local IO generator 146 to address the issues arising in the implementation of the circuitry 50. As illustrated, the local IO generator 146 receives the MIO 60 and the MIOF 62 from the driving circuitry 140. Instead of receiving the MIO 60 and the MIOF 62 at sources of the transistors 88 and 92, as illustrated in FIG. 2B, the local IO generator 146 receives the MIO 60 and the MIOF 62 at a gate of respective transistors 148 and 150. By receiving the MIO 60 and the MIOF 62 at the gates of the respective transistors 148 and 150, the MIO 60 and the MIOF 62 does not have to be at or near VDD 77. Instead, MIO 60 or MIOF 62 may be at a (relatively much) lower voltage. As an example of the circuitry 50 in FIGS. 2A and 2B, if the VDD 77 is 1.2 V, the MIO 60 and MIOF 62 may have a peak voltage of 1.2V or 1.2V minus $V_{TH}$ (e.g., 0.3V) depending on whether driving circuitry 52 or 118 is included in the circuitry 50. Thus, MIO 60 and MIOF 62 may tie to 1.2V or 0.9V in some embodiments. However, in the circuitry 140, MIO 60 and MIOF 62 may have a peak voltage that is the $V_{TH}$ (e.g., 0.3V) of the transistors 148 and 150. In some embodiments, the peak voltage of MIO 60 and MIOF 62 may include a cushion (e.g., 0.1V-0.2V) to ensure that the transistors 148 and 150 are operating in a steady state of their respective characteristic curves. In other words, the local IO generator 146 may provide for a voltage (and resultant current) savings that is equivalent to VDD 77 (e.g., 1.2V or 0.9V) minus VMIO 144 peak (e.g., 0.4V-0.5V). In the current example, the local IO generator 146 enables use of roughly half to one-third of the current consumed in the circuitry 50 to perform the same operations.

To ensure that the MIO 60 and/or MIOF 62 is accessed by the source amps 58 when a write is enabled, transistors 152 and 154 respectively connect the VSS 73 to the transistors 148 and 150 when the write enable 64 is received. As an example, during a write, if the MIOF 62 is low and the MIO 60 is high, and the write enable 64 is turned on. This will pull LIO 90 low, and cross-coupled p-channel transistor 156 pulls LIOF 94 high. Similarly, during a write, if the MIOF 62 is high and the MIO 60 is low, and the write enable 64 is turned on. LIOF 94 will pull low, and cross-coupled p-channel transistor 158 pulls LIO 90 high.

When a corresponding column selector turns on, the local sensing amplifier 100 will be overwritten. The pulldown transistors 148 and 150 being local to the respective sensing amplifier 58 addresses write performance variance and overwriting difficulties for the sensing amplifiers 58. Overwriting difficulties are addressed by moving the resistive data lines (MIO 60 and MIO 62) outside of the path of overwriting the sensing amplifier 58. The sensing amplifier 58 write performance variance is addressed by the pull down transistors 148 and 150 being local to the sensing amplifier 58 to equalize performance between sensing amplifiers 58.

Although the foregoing discusses various logic-low and/or logic-high assertion polarities, at least some of these polarities may be inverted in some embodiments. Furthermore, in some embodiments, logic gates as discussed herein may be replaced with similar logical functions, such as an inverter replaced with a single NAND gate or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device comprising:
   a main input-output line;
   driving circuitry configured to generate a main input-output signal on the main input-output line; and
   a plurality of sensing amplifier coupled to the main input-output line and each configured to be written to or transmit data over the main input-output line, wherein each sensing amplifier comprises:
      a local data line;
      local data line generation circuitry configured to generate a local data signal on the local data line, wherein the local data line generation circuitry comprises a gate transistor in series with a pull-down transistor, wherein the gate transistor is configured to receive a write enable signal to control whether the pull-down transistor coupling to the low voltage is completed, and wherein the local data line generation circuitry is configured to block connection of a local false line to the low voltage via a complementary pull-down transistor when the pull-down transistor couples the local data line to the low voltage; and
      a plurality of local sensing amplifiers coupled to the local data line generation circuitry via the local data line.

2. The memory device of claim 1 comprising a main input-output false line that is complementary to the main input-output line, wherein the main input-output false line is generated by the driving circuitry.

3. The memory device of claim 2, wherein the local data line generation circuitry generates the local false line using the main input-output false line, wherein the local false line is complementary to the local data line.

4. The memory device of claim 1, wherein the local data line generation circuitry comprises a pull-down transistor that is configured to receive the main input-output line at a gate of the pull-down transistor and selectively couple the local data line to a low voltage.

5. The memory device of claim 1, wherein the local data line comprises a pair of cross-p-channel transistors that are configured to respond to a connection of the local data line to the low voltage by connecting the local false line to a high voltage and to respond to a connection of the local false line to the low voltage through the complementary pull-down transistor by connecting the local data line to a high voltage.

6. The memory device of claim 1, wherein the driving circuitry is configured to set the main input-output signal based at least in part on a write enable signal.

7. The memory device of claim 6, wherein the driving circuitry is configured to set the main input-output signal based on a data signal.

* * * * *